US007032038B1

(12) United States Patent
Squires

(10) Patent No.: US 7,032,038 B1
(45) Date of Patent: Apr. 18, 2006

(54) CONFIGURABLE PERIPHERAL DEVICES

(75) Inventor: David B. Squires, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 1 day.

(21) Appl. No.: 09/815,555

(22) Filed: Mar. 22, 2001

(51) Int. Cl.
*G06F 13/00* (2006.01)
*G06F 3/00* (2006.01)

(52) U.S. Cl. ............... 710/8; 710/62; 710/72
(58) Field of Classification Search ............ 710/8, 710/10, 62, 72, 73; 703/24, 25
See application file for complete search history.

(56) References Cited

U.S. PATENT DOCUMENTS

| 4,748,654 | A | * | 5/1988 | Gray | 379/40 |
| 4,761,763 | A | * | 8/1988 | Hicks | 710/106 |
| 5,307,464 | A | * | 4/1994 | Akao et al. | 345/810 |
| 5,428,748 | A | * | 6/1995 | Davidson et al. | 710/9 |
| 5,812,867 | A | * | 9/1998 | Basset | 712/1 |
| 5,968,161 | A | * | 10/1999 | Southgate | 712/37 |
| 6,029,155 | A | * | 2/2000 | Bass et al. | 705/401 |
| 6,085,337 | A | * | 7/2000 | Mattheis et al. | 714/30 |
| 6,145,020 | A | * | 11/2000 | Barnett | 710/8 |
| 6,189,052 | B1 | * | 2/2001 | Nilsson et al. | 710/48 |

OTHER PUBLICATIONS

Xilinx, "The Programmable Logic Data Book 2000", Chapter 3, available from Xilinx, Inc., 2100 Logic Drive, San Jose, California 95124, Feb. 28, 2000.

* cited by examiner

*Primary Examiner*—KIm Huynh
(74) *Attorney, Agent, or Firm*—H. C. Chan; W. Eric Webostad

(57) ABSTRACT

A single integrated circuit can be designed to include a processor core and one or more configurable peripheral devices selectable by a user. Because the peripheral device is configurable, the user can select only the features he/she needs in the integrated circuit. As a result, the peripheral devices included in the integrated circuit do not have to be flexibly designed in the same manner as commercially available peripheral devices. Consequently, they are easy to use.

18 Claims, 4 Drawing Sheets

CONFIGURABLE PERIPHERAL DEVICES

FIELD OF THE INVENTION

The present invention generally relates to data processor systems, and more particularly to a data processor system implemented on a programmable logic device having user selectable peripheral devices.

BACKGROUND OF THE INVENTION

Microprocessors are one of the most versatile electronic devices used by engineers. Typically, a microprocessor is able to recognize and execute a predetermined set of instructions (e.g., add, compare, subtract, jump, etc.). Engineers can direct a microprocessor to handle different tasks by writing different computer programs using the same set of instructions. As a result, different types of products can use the same microprocessor by changing the associated computer programs.

A microprocessor is typically used with a number of peripheral integrated circuit (IC) devices (such as serial interface, parallel input-output device, interrupt controller, disk drive controller, etc.). In many cases, a microprocessor manufacturer supplies a family of peripheral ICs that works best with its microprocessors. Because microprocessors are used in many types of products, these peripheral ICs also need to be flexible enough to be used in many types of products. This flexibility comes with a price: it is more difficult to use the peripheral ICs and the cost of the extra registers, logic, memory, etc. required to make the peripheral flexible, increases the cost of the peripheral. Another reality of casting peripherals into silicon is that it is extremely difficult to anticipate future changes to standards. If such "future" standards could be incorporated into a peripheral, the value of the peripheral would be greatly enhanced.

SUMMARY OF THE INVENTION

The above problems can be solved by having a single IC that includes a processor core and one or more peripheral devices selected by a user. Because the peripheral device is configurable, the user can select just the features he/she needs in the IC. As a result, the peripheral devices included in the IC do not have to be flexibly designed in the same manner as commercially available peripheral devices. Consequently, they are easy to use. Because the peripheral device is configurable, the peripheral can be modified over the lifetime of the system. This provides the possibility to adapt to future changes in standards, even after the microprocessor system has been deployed in the field. It also affords the possibility to increase the performance or alter the operation of the peripheral after deployment.

In one embodiment of the present invention, a menu system is used to help the user configure the peripherals and select which peripherals are to be connected to the microprocessor.

The above summary of the present invention is not intended to describe each disclosed embodiment of the present invention. The figures and detailed description that follow provide additional example embodiments and aspects of the present invention.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE INVENTION

Several examples of configurable peripheral devices will be described. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

Figure 1:
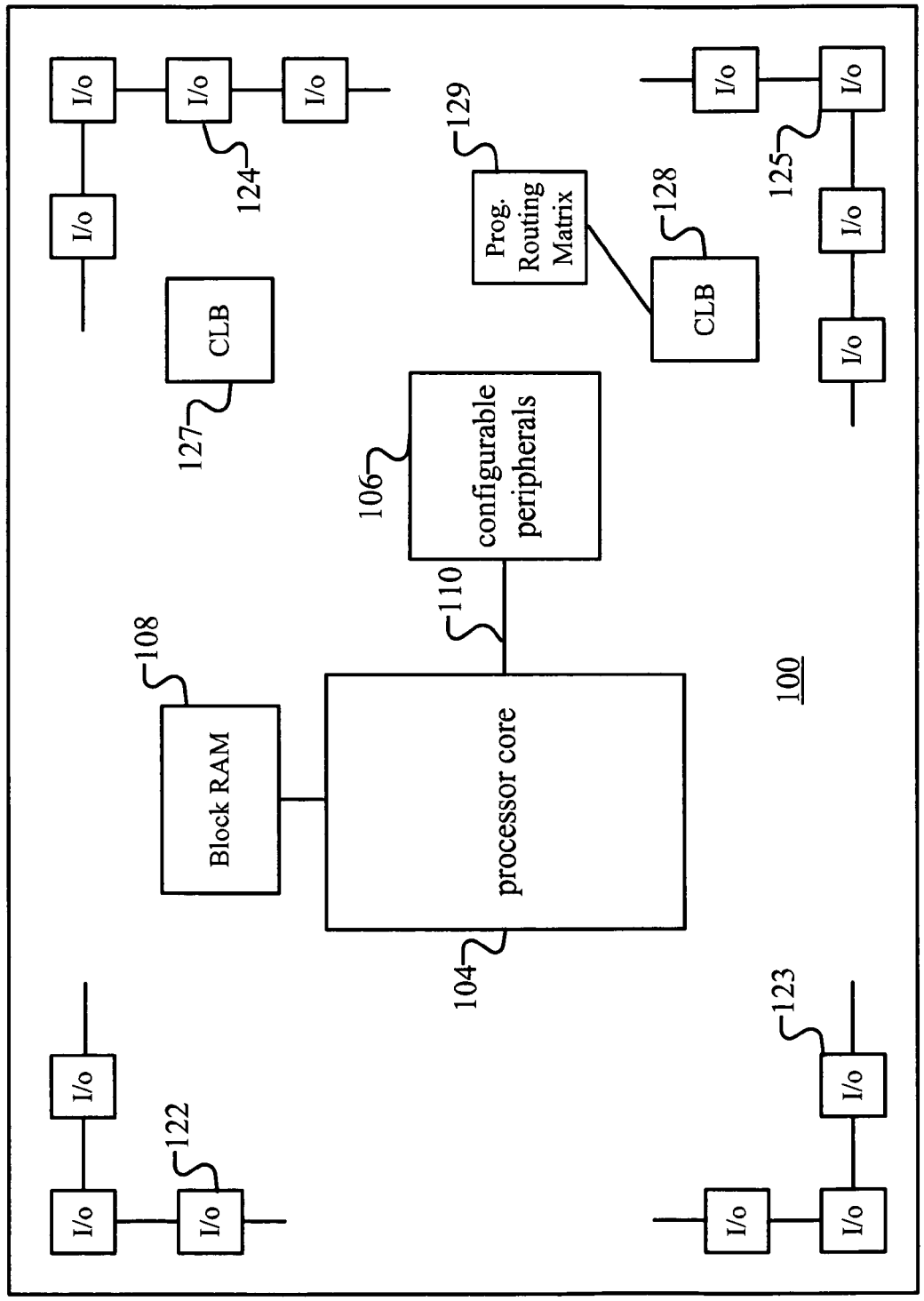
FIG. 1 is a schematic diagram of an IC containing a configurable processor system of the present invention.

FIG. 1 is a schematic diagram of an IC 100 containing a configurable processor system of the present invention. IC 100 contains a processor core 104, one or more configurable peripheral devices 106, and an optional RAM 108 attached to processor core 104. Peripheral devices 106 communicate with processor core 104 using a bus 110. Processor core 104 is typically non-configurable, but may also be configurable.

In one embodiment of the present invention, IC 100 is a field programmable gate array that further contains a plurality of input-output (I/O) blocks, such as blocks 122–125, and a plurality of configurable logic blocks (CLBs) which provide functional elements for constructing logic, such as blocks 127–128. Detail description of these blocks can be found in "The Programmable Logic Data Book 2000," Chapter 3, published by Xilinx, Inc, the content of which is incorporated herein by reference. These blocks can be used to build other circuits that may be connected to the system of the present invention. The circuit of FIG. 1 also provides a programmable routing matrix 129. The programmable routing matrix could provide local routing, general purpose routing, I/O routing or dedicated routing. For example, local routing resources could comprise interconnections among CLBs and routing matrices, internal CLB feedback paths that provide high-speed connections to look-up tables within the same CLB, or direct paths that provide high-speed connections between horizontal adjacent CLBs. General purpose routing could comprise a routing matrix having routing resources located in horizontal and vertical routing channels associated with the CLB rows and columns. The programmable routing matrix could also comprise additional routing resources that form an interface between CLBs and the IOBs. Finally, some classes of signals require dedicated routing resources to maximize performance.

Figure 2A:
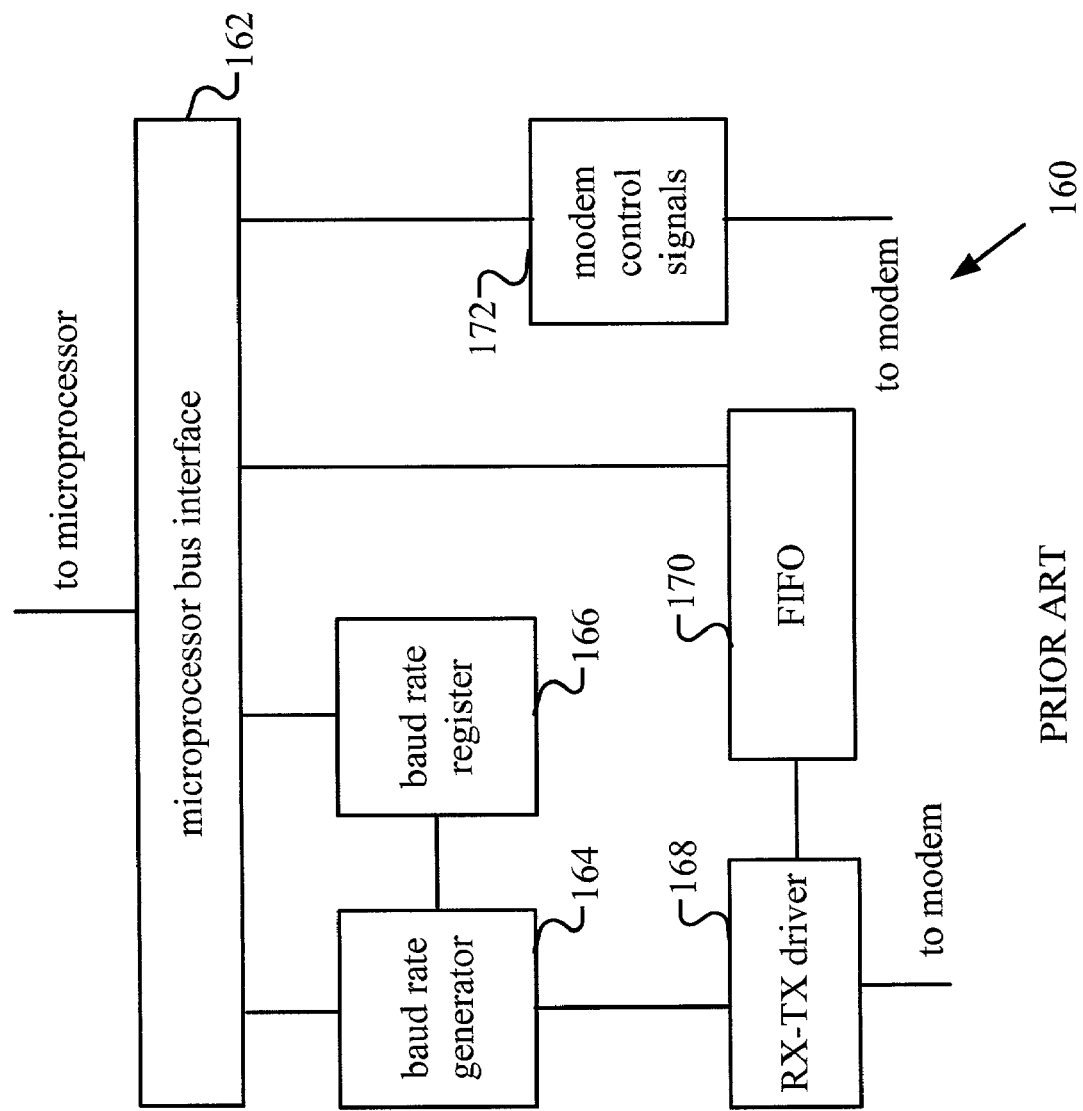
FIG. 2A is a block diagram of a prior art UART.

The present invention allows a user to include one or more peripheral devices in IC 100. In this invention, a peripheral device is defined as a circuit that (a) delivers signals to a device external to IC 100 in response to commands by processor core 104 and (b) receives signals from the external device and delivers the signals (sometimes in a modified form) to processor core 104. Examples of peripheral devices are universal asynchronous receiver transmitter (UART), parallel port interface, Ethernet interface, flash memory controller, etc. In the present invention, these peripheral devices can be tailor-made to meet the needs of the users. As an example, consider a prior art UART 160 of FIG. 2A. It contains a microprocessor bus interface unit 162 that is connected to a microprocessor. It also contains a baud rate generator 164 and an associated baud rate register 166. A user can control the baud rate of UART 160 by writing to register 166. UART 160 contains a receiver-transmitter (RX-TX) 168 that receives and sends serial data at the selected baud rate to an external modem (not shown). In order to enhance the performance of UART 160, a FIFO buffer 170 is used to temporarily store the data. UART 160 also contains a modem control signal generator 172 that generates standard control signals, such as the RTS and CTS signals.

Figure 2B:
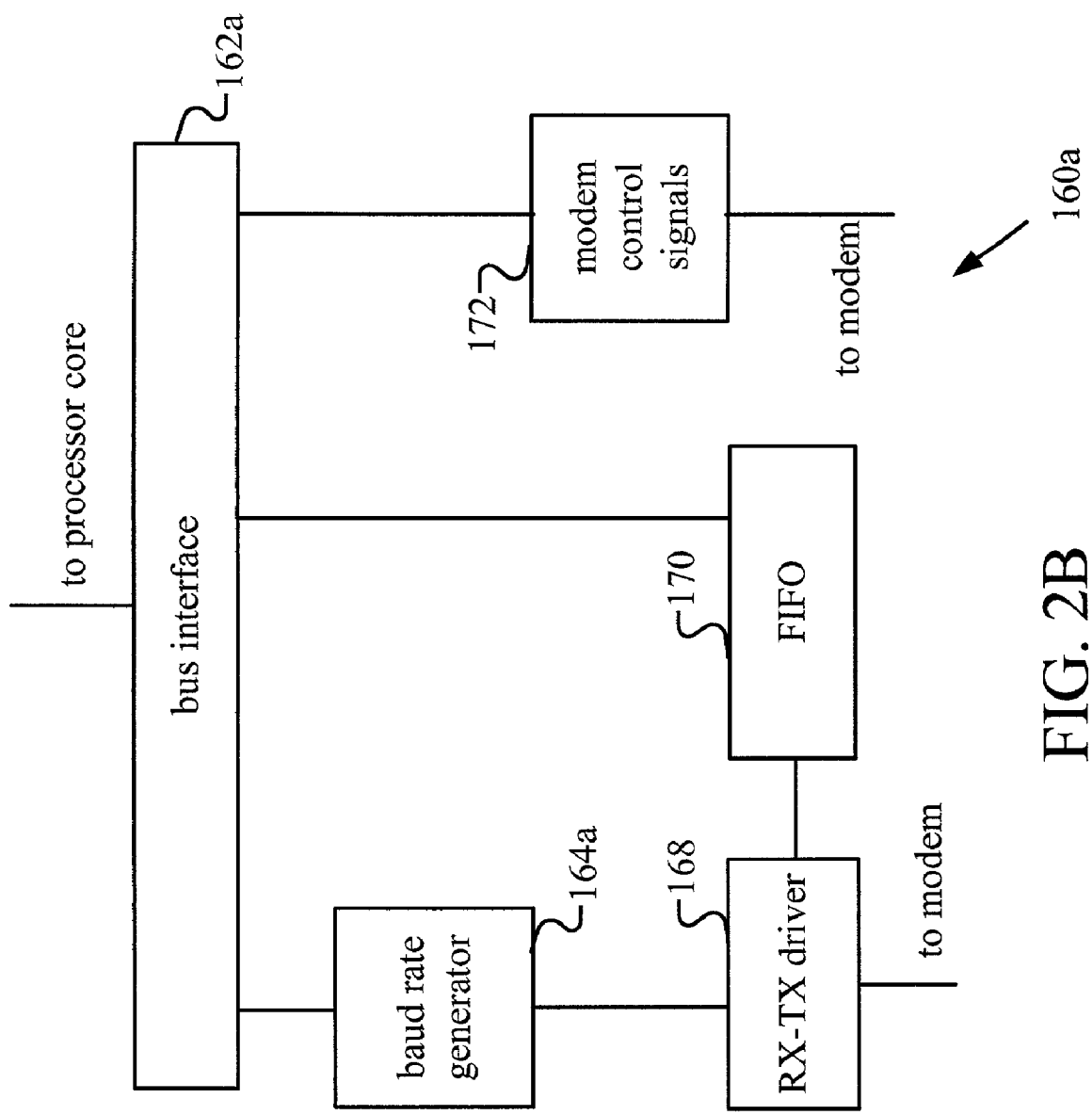
FIG. 2B is a block diagram of an UART of the present invention.

Prior art UART 160 is designed to serve general engineering usage. As a result, it includes baud rate register 166 and associated control logic to allow users to easily change the baud rate of UART 160. In the present invention, a user may only need to use a single baud rate, and there is no need to include register 166 and associated logic. As a result, the complexity of the design is reduced. FIG. 2B shows an UART 160a of the present invention that does not contain register 166. Elements common in FIGS. 2A and 2B use the same reference numerals. UART 160a contains a bus interface 162a that can communicate with processor core 104. A baud rate generator 164a, designed to generate a single baud rate, is implemented in UART 160a.

It should be noted that other peripheral devices may be configured using the same principle to reduce the complexity of the design.

Figure 3A:
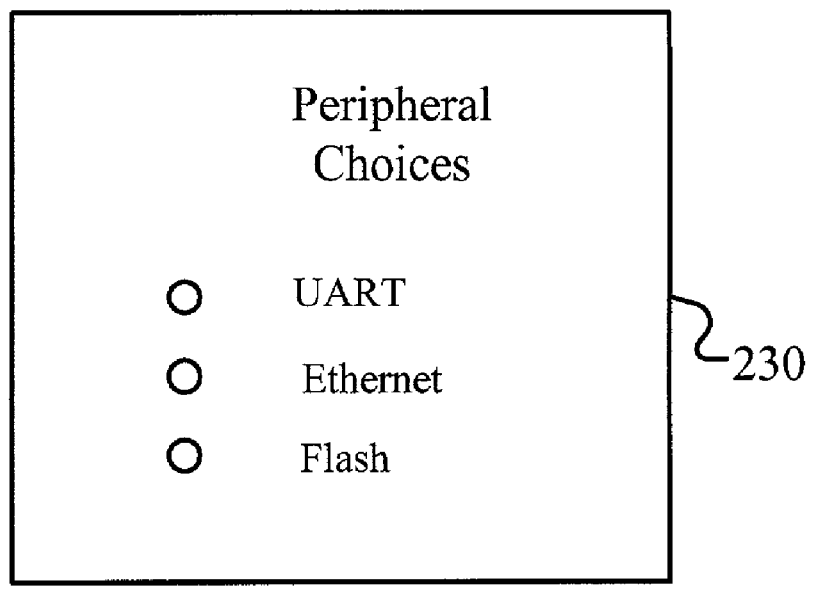
FIGS. 3A–3C show an exemplary menu system of the present invention.
Figures 3B, 3C:
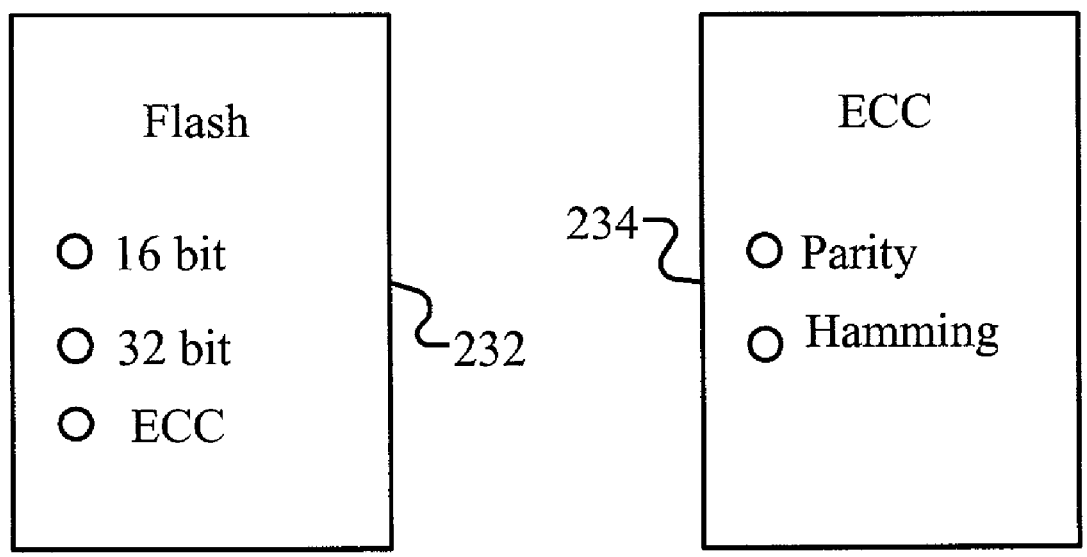

The user can select his/her design choices using a menu system. FIG. 3A shows a menu 230 that allows a user to select from a UART, Ethernet controller or flash controller as a target peripheral. Note that the user may select more than one peripheral. Assuming that the user selects a flash controller, a second menu 232 (FIG. 3B) allows the user to select 16-bit, 32 bit and error correction code (ECC) designs. If the user selects ECC, another menu 234 (FIG. 3C) allows the user to select one of several codes. After all the information is entered, a VHDL file will be generated to implement the design. Note that the choices shown in FIGS. 3A–3C are listed as examples only, and various choices can be implemented to meet the needs of users, and the method of implementing the design is not limited to VHDL.

Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

What is claimed is:

1. An integrated circuit comprising:
   a processor core;
   a configurable peripheral device comprising a configurable logic block having circuitry capable of implementing a plurality of logic functions;
   a bus coupled between said processor core and said configurable peripheral device, said bus connecting said processor core and said configurable peripheral device without using a sub-processor;
   a programmable routing matrix coupled to said configurable logic block, said programmable routing matrix coupling signals to and from said configurable logic block; and
   an input/output block coupled to said programmable routing matrix, wherein said programmable routing matrix provides input/output routing for said configurable peripheral device by way of said input/output block without using a sub-processor; wherein said processor core, said configurable peripheral device and said bus are implemented on a field programmable gate array.

2. The integrated circuit of claim 1 wherein said configurable peripheral device is a universal asynchronous receiver transmitter (UART).

3. The integrated circuit of claim 2 wherein said UART has a fixed baud rate.

4. The integrated circuit of claim 1 wherein said configurable peripheral device is a flash memory controller.

5. The integrated circuit of claim 1 wherein said input-output block comprises a configurable input/output block.

6. The integrated circuit of claim 1 wherein said configurable logic block comprises a baud rate generator implemented in configurable logic.

7. The integrated circuit of claim 6 wherein said configurable logic block comprises a transmitter-receiver circuit coupled to said baud rate generator and implemented in configurable logic.

8. A system allowing a user to select peripheral devices in a programmable logic device, comprising:
   a menu system allowing said user to select one of a plurality of configurable peripheral devices;
   a processor core;
   a configurable peripheral device comprising a configurable logic block having circuitry capable of implementing a plurality of logic functions;
   a bus coupled between said processor core and said configurable peripheral device, said bus connecting said processor core and said configurable peripheral device without using a sub-processor;
   a programmable routing matrix coupled to said configurable logic block, said programmable routing matrix coupling signals to and from said configurable logic block; and
   an input/output block coupled to said programmable routing matrix, wherein said programmable routing matrix provides input/output routing for said configurable peripheral device by way of said input/output block without using a sub-processor; wherein said processor core, said configurable peripheral device and said bus are implemented on a field programmable gate array.

9. The system of claim 8 wherein said user selectable options comprise at least one of a UART peripheral selector, an Ethernet peripheral selector and a flash memory peripheral selector.

10. The system of claim 9 wherein said user selectable options comprise at least one data width size selector responsive to selection of said flash memory peripheral selector.

11. The system of claim 9 wherein said user selectable options comprise an error correction selector responsive to selection of said flash memory peripheral selector.

12. The system of claim 11 wherein said user selectable options comprise at least one error correction code selector responsive to selection of said error correction selector.

13. The system of claim 8 wherein said configurable logic block comprises a universal asynchronous receiver transmitter implemented in configurable logic.

14. The system of claim 13 wherein said universal asynchronous receiver transmitter comprises a baud rate generator implemented in configurable logic to generate a single baud rate.

15. The system of claim 8 wherein said input-output block comprises a configurable input/output block.

16. An integrated circuit comprising:
   a processor core;
   a universal asynchronous receiver transmitter circuit having a baud rate generator implemented in a configurable logic block having circuitry capable of implementing a plurality of logic functions;

a bus coupled between said processor core and said universal asynchronous receiver transmitter circuit;

a programmable routing matrix coupled to said configurable logic block, said programmable routing matrix coupling signals to and from said configurable logic block; and an input/output block coupled to said programmable routing matrix, wherein said programmable routine matrix provides input/output routing for said universal asynchronous receiver transmitter by way of said input/output block without using a sub-processor; wherein said processor core, said universal asynchronous receiver transmitter circuit and said bus are implemented on a field programmable gate array.

17. The integrated circuit of claim 16 wherein said processor core comprises a configurable processor core.

18. The integrated circuit of claim 16 wherein said baud rate generator has a fixed baud rate.

* * * * *